United States Patent
Kinoshita

(10) Patent No.: US 9,261,773 B2
(45) Date of Patent: Feb. 16, 2016

(54) REFLECTIVE MASK BLANK FOR EUV LITHOGRAPHY, AND REFLECTIVE LAYER-COATED SUBSTRATE FOR EUV LITHOGRAPHY

(71) Applicant: Asahi Glass Company, Limited, Chiyoda-ku (JP)

(72) Inventor: Takeru Kinoshita, Chiyoda-ku (JP)

(73) Assignee: Asahi Glass Company, Limited, Chiyoda-ku (JP)

( * ) Notice: Subject to any disclaimer, the term of this patent is extended or adjusted under 35 U.S.C. 154(b) by 171 days.

(21) Appl. No.: 14/182,688

(22) Filed: Feb. 18, 2014

(65) Prior Publication Data

US 2014/0234756 A1     Aug. 21, 2014

(30) Foreign Application Priority Data

Feb. 20, 2013   (JP) .................. 2013-030848

(51) Int. Cl.
    *G03F 1/24*    (2012.01)
(52) U.S. Cl.
    CPC ....................... *G03F 1/24* (2013.01)
(58) Field of Classification Search
    CPC .......................................... G03F 1/24
    USPC ............................................ 430/5
    See application file for complete search history.

(56) References Cited

U.S. PATENT DOCUMENTS

| | | | |
|---|---|---|---|
| 6,011,646 A | 1/2000 | Mirkarimi et al. | |
| 6,134,049 A | 10/2000 | Spiller et al. | |
| 6,333,961 B1 | 12/2001 | Murakami | |
| 6,396,900 B1 | 5/2002 | Barbee, Jr. et al. | |
| 7,162,009 B2 | 1/2007 | Kanazawa et al. | |
| 7,203,275 B2 | 4/2007 | Shiraishi | |
| 7,382,527 B2 | 6/2008 | Kandaka et al. | |
| 7,511,888 B2 | 3/2009 | Sekine | |
| 7,804,648 B2 | 9/2010 | Hosoya et al. | |
| 8,105,735 B2 | 1/2012 | Kinoshita | |
| 2007/0171327 A1 | 7/2007 | Matsumodo et al. | |
| 2011/0228245 A1 | 9/2011 | Mann | |
| 2011/0266140 A1 | 11/2011 | Kinoshita et al. | |
| 2012/0134015 A1 | 5/2012 | Paul et al. | |
| 2012/0212810 A1 | 8/2012 | Paul et al. | |

(Continued)

FOREIGN PATENT DOCUMENTS

| | | |
|---|---|---|
| JP | 2001-57328 | 2/2001 |
| JP | 2002-504715 | 2/2002 |

(Continued)

OTHER PUBLICATIONS

U.S. Appl. No. 14/134,433, filed Dec. 19, 2013. Kinoshita, et al.

*Primary Examiner* — Stephen Rosasco
(74) *Attorney, Agent, or Firm* — Oblon, McClelland, Maier & Neustadt, L.L.P.

(57) ABSTRACT

To provide a mask blank for EUVL wherein the incident angle dependence of EUV reflectivity and the film stress in a Mo/Si multilayer reflective film are improved, and a reflective layer-equipped substrate for such a mask blank. The reflective layer-equipped substrate for EUV lithography (EUVL), comprises a substrate, and a reflective layer for reflecting EUV light, formed on the substrate, wherein the reflective layer comprises a second multilayer reflective film having a Mo layer and a Si layer alternately stacked plural times on the substrate, an adjustment layer stacked on the second multilayer reflective film, and a first multilayer reflective film having a Mo layer and a Si layer alternately stacked plural times on the adjustment layer.

9 Claims, 1 Drawing Sheet

(56) References Cited

U.S. PATENT DOCUMENTS

| | | |
|---|---|---|
| 2013/0115547 A1 | 5/2013 | Mikami et al. |
| 2014/0017601 A1 | 1/2014 | Mikami |

FOREIGN PATENT DOCUMENTS

| | | |
|---|---|---|
| JP | 2002-525698 | 8/2002 |
| JP | 2005-56943 | 3/2005 |
| JP | 2007-134464 | 5/2007 |
| JP | 4338977 | 10/2009 |
| JP | 4356696 | 11/2009 |
| JP | 4466566 | 5/2010 |
| JP | 4532991 | 8/2010 |
| JP | 2011-228699 | 11/2011 |
| JP | 4905914 | 3/2012 |
| JP | 2012-524391 | 10/2012 |
| JP | 2012-532467 | 12/2012 |

REFLECTIVE MASK BLANK FOR EUV LITHOGRAPHY, AND REFLECTIVE LAYER-COATED SUBSTRATE FOR EUV LITHOGRAPHY

BACKGROUND OF INVENTION

1. Field of Invention

The present invention relates to a reflective mask blank for EUV (Extreme Ultraviolet) lithography (hereinafter referred to also as "EUV mask blank" in this specification) to be used for e.g. production of semiconductors.

Further, the present invention relates to a reflective layer-coated substrate for EUV lithography (EUVL). The reflective layer-coated substrate for EUVL is useful as a precursor for a mask blank for EUVL.

2. Discussion of Background

Heretofore, in the semiconductor industry, a photolithography method employing visible light or ultraviolet light has been used as a technique to transfer a fine pattern required to form an integrated circuit with a fine pattern on e.g. a silicon substrate. However, the conventional photolithography method has come close to its limit, while miniaturization of semiconductor devices is being accelerated. In the case of the photolithography method, the resolution limit of a pattern is about ½ of the exposure wavelength. Even if an immersion method is employed, the resolution limit is said to be about ¼ of the exposure wavelength, and even if an immersion method of ArF laser (wavelength: 193 nm) is employed, about 45 nm is presumed to be the limit. Under the circumstances, as an exposure technique for the next generation employing an exposure wavelength shorter than 45 nm, EUV lithography is expected to be prospective, which is an exposure technique employing EUV light having a wavelength further shorter than ArF laser. In this specification, EUV light is meant for light ray having a wavelength within a soft X-ray region or within a vacuum ultraviolet region, specifically for light ray having a wavelength of from about 10 to 20 nm, particularly about 13.5 nm±0.3 nm.

EUV light is likely to be absorbed by all kinds of substances, and the refractive index of substances at such a wavelength is close to 1, whereby it is not possible to use a conventional refractive optical system like photolithography employing visible light or ultraviolet light. Therefore, in EUV lithography, a reflective optical system, i.e. a reflective photomask and mirror, is employed.

A mask blank is a layered product before pattering, to be used for the production of a photomask. In the case of an EUV mask blank, it has a structure wherein a reflective layer to reflect EUV light and an absorber layer to absorb EUV light, are formed in this order on a substrate made of e.g. glass.

Usually, a protective layer is formed between the above reflective layer and the absorber layer. Such a protective layer is provided for the purpose of protecting the reflective layer, so that the reflective layer will not be damaged by an etching process to be carried out for the purpose of forming a pattern in the absorber layer.

As the reflective layer, it is common to use a Mo/Si multilayer reflective film having a molybdenum (Mo) layer as a layer to show a low refractive index to EUV light and a silicon (Si) layer as a layer to show a high refractive index to EUV light alternately stacked to have the light reflectivity improved when the layer surface is irradiated with EUV light.

For the absorber layer, a material having a high absorption coefficient to EUV light, specifically e.g. a material containing chromium (Cr) or tantalum (Ta) as the main component, is used.

Along with a trend for higher NA (numerical aperture) for an exposure device to be used for EUV lithography, an incident angle dependence of the reflectivity at the mirror surface to be used in a reflective optical system has been problematic (Patent Document 1).

Such an incident angle dependence of the reflectivity becomes problematic also in a reflective photomask and a mask blank as a precursor for such a photomask.

For example, if the specification for NA becomes 0.45 from current 0.33, the incident angle θ of EUV light will be required to satisfy the reflectivity characteristics by expanding its range to ±15° from ±11°. The index for the reflectivity characteristics to be required in such a case has not yet been specified, but at least at one wavelength within a range of from 13.2 nm to 13.8 nm, a reflectivity of EUV light of at least 50% will be required in the entire range of −15°≤θ≤+15°, and it will be required that the fluctuation range of the EUV reflectivity within the above range of θ is small. As a specific example, at least it is required that when the minimum value is represented by $R_{min}$ (%), the fluctuation range of the EUV reflectivity in the above range of θ is within $R_{min} \times 1/10$.

Further, also in a mirror to be used in a reflective optical system, a Mo/Si multilayer reflective film is used as a reflective layer, and in the case of such a Mo/Si multilayer, a deformation of the substrate caused by an internal stress based on its structure has been problematic (Patent Document 2).

And, in the case of a reflective photomask employing a Mo/Si multilayer reflective film as a reflective layer, and a mask blank to be used for such a photomask, higher flatness than a mirror to be used in a reflective optical system is required, and accordingly, a deformation of the substrate caused by an internal stress of the Mo/Si multilayer reflective film becomes more problematic.

PRIOR ART DOCUMENTS

Patent Documents

Patent Document 1: Japanese Patent No. 4,466,566
Patent Document 2: Japanese Patent No. 4,356,696

SUMMARY OF INVENTION

Technical Problems

In order to solve the above problems of the prior art, it is an object of the present invention to provide a mask blank for EUVL which is excellent in the properties as an EUV mask blank, specifically one wherein the incident angle dependence of EUV reflectivity and the film stress in a Mo/Si multilayer reflective film are improved, and a reflective layer-coated substrate for such a mask blank.

Solution to Problem

In order to accomplish the above object, the present invention provides a reflective layer-coated substrate for EUV lithography (EUVL), comprising a substrate, and a reflective layer for reflecting EUV light, formed on the substrate, wherein the reflective layer comprises a second multilayer reflective film having a Mo layer and a Si layer alternately stacked plural times on the substrate, an adjustment layer stacked on the second multilayer reflective film, and a first multilayer reflective film having a Mo layer and a Si layer alternately stacked plural times on the adjustment layer;

in the first multilayer reflective film, from 20 to 36 sets are stacked in such a relation that the first cycle length $d_1$ being the total thickness of one set of adjacent Mo layer and Si layer is 6.8 nm≤$d_1$≤7.2 nm;

in the adjustment layer, a Mo layer and a Si layer are alternately stacked in at least one set, the total thickness $d_3$ of adjacent Mo layer and Si layer satisfies $d_3$≤0.8$d_1$ or 1.2$d_1$≤$d_3$, and the thickness L of the entire adjustment layer is (0.3+i)$d_1$≤L≤(0.7+i)$d_1$, wherein i is an integer greater than or equal to 0;

in the second multilayer reflective film, from 3 to 31 sets are stacked in such a relation that the second cycle length $d_2$ being the total thickness of one set of adjacent Mo layer and Si layer is 0.9$d_1$≤$d_2$≤1.1$d_1$;

the ratio of the thickness of a Mo layer in the first multilayer reflective film to the first cycle length $d_1$ is from 0.25 to 0.55;

the ratio of the thickness of a Mo layer in the second multilayer reflective film to the second cycle length $d_2$ is from 0.25 to 0.55; and the total thickness of the reflective layer is at most 600 nm.

In the reflective layer-coated substrate for EUVL of the present invention, the total thickness of the reflective layer is preferably at most 400 nm.

In the reflective layer-coated substrate for EUVL of the present invention, the first cycle length $d_1$ and the second cycle length $d_2$ are preferably substantially equal.

In the reflective layer-coated substrate for EUVL of the present invention, the ratio of the thickness of a Mo layer in the adjustment layer to the third cycle length $d_3$ is preferably from 0.3 to 0.7.

Further, the present invention provides a reflective mask blank for EUV lithography (EUVL), comprising a substrate, a reflective layer for reflecting EUV light, formed on the substrate, and an absorber layer for absorbing EUV light, formed on the reflective layer, wherein the reflective layer comprises a second multilayer reflective film having a second low refractive index layer and a second high refractive index layer alternately stacked plural times on the substrate, an adjustment layer stacked on the second multilayer reflective film, and a first multilayer reflective film having a Mo layer and a Si layer alternately stacked plural times on the adjustment layer;

in the first multilayer reflective film, from 20 to 36 sets are stacked in such a relation that the first cycle length $d_1$ being the total thickness of one set of adjacent Mo layer and Si layer is 6.8 nm≤$d_1$≤7.2 nm;

in the adjustment layer, a Mo layer and a Si layer are alternately stacked in at least one set, the total thickness $d_3$ of adjacent Mo layer and Si layer satisfies $d_3$≤0.8$d_1$ or 1.2$d_1$≤$d_3$, and the thickness L of the entire adjustment layer is (0.3+i)$d_1$≤L≤(0.7+i)$d_1$, wherein i is an integer greater than or equal to 0;

in the second multilayer reflective film, from 3 to 31 sets are stacked in such a relation that the second cycle length $d_2$ being the total thickness of one set of adjacent Mo layer and Si layer is 0.9$d_1$≤$d_2$≤1.1$d_1$;

the ratio of the thickness of a Mo layer in the first multilayer reflective film to the first cycle length $d_1$ is from 0.25 to 0.55;

the ratio of the thickness of a Mo layer in the second multilayer reflective film to the second cycle length $d_2$ is from 0.25 to 0.55; and the total thickness of the reflective layer is at most 600 nm.

In the reflective mask blank for EUVL of the present invention, the total thickness of the reflective layer is preferably at most 400 nm.

In the reflective mask blank for EUVL of the present invention, the first cycle length $d_1$ and the second cycle length $d_2$ are preferably substantially equal.

In the reflective mask blank for EUVL of the present invention, the ratio of the thickness of a Mo layer in the adjustment layer to the third cycle length $d_3$ is preferably from 0.3 to 0.7.

The reflective mask blank for EUVL of the present invention may have a protective layer for the reflective layer, between the reflective layer and the absorber layer.

Advantageous Effects of Invention

According to the present invention, the incident angle dependence of EUV reflectivity in the reflective layer is improved. At an incident angle θ of EUV light being in a range of −15°≤θ≤+15°, the reflectivity of EUV light is at least 50%, and the fluctuation range of the EUV reflectivity in the above range of θ is within $R_{min}$×1/10. Thus, the present invention is applicable even to an exposure device with NA of 0.45.

Further, the film stress in the reflective layer is reduced. Specifically, the absolute value of the film stress in the reflective layer becomes to be at most 450 MPa. As a result, warpage due to the film stress is reduced, and the flatness of the mask blank for EUVL is improved.

Further, by reduction of the thickness of the reflective layer, throughput at the time of production of the mask blank for EUVL will be improved.

PREFERRED EMBODIMENTS OF INVENTION

Now, the present invention will be described with reference to the drawings.

Figure 1:
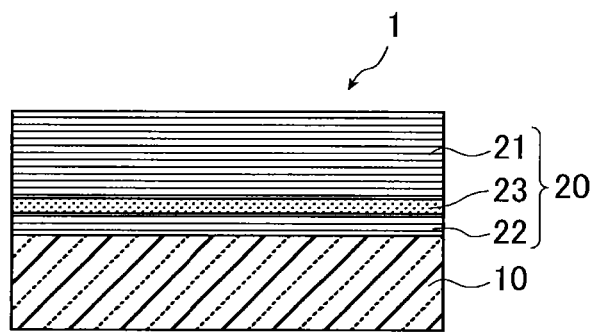
FIG. 1 is a schematic cross-sectional view illustrating an embodiment of the reflective layer-coated substrate for EUVL of the present invention.

FIG. 1 is a schematic cross-sectional view illustrating an embodiment of the reflective layer-coated substrate for EUVL of the present invention.

In the reflective layer-coated substrate 1 for EUVL, a reflective layer 20 for reflecting EUV light is formed on a substrate 10.

With the reflective layer-coated substrate 1 for EUVL of the present invention, when light ray within an EUV wavelength region is applied to the surface of the reflective layer 20, the EUV reflectivity satisfies the following conditions.

When the angle in a direction perpendicular to the surface of the reflective layer 20 is regarded to be 0°, at an incident angle θ of EUV light being within a range of −15°≤θ≤+15°, the EUV reflectivity is at least 50%, and when the minimum value of the EUV reflectivity in the above range of θ is represented by $R_{min}$ (%), the fluctuation range of the EUV reflectivity in the above range of θ is within $R_{min}$×1/10.

Here, at an incident angle θ of EUV light being in the vicinity of 0°, specifically within a range of −1°≤θ≤+1°, a shade is likely to be present at the time of measuring the EUV reflectivity, so that it becomes difficult to accurately measure the EUV reflectivity. In such a case, a film structure model to obtain a simulation result close to the reflection spectrum measured at another incident angle may be obtained, and by using such a film structure model, the reflection spectrum may be calculated and complemented.

With the reflective layer-coated substrate 1 for EUVL of the present invention, the EUV reflectivity in the above range of θ is preferably at least 52%, more preferably at least 54%.

Further, the fluctuation range of the EUV reflectivity in the above range of θ is preferably within $R_{min} \times 0.08$, more preferably within $R_{min} \times 0.06$.

In order to satisfy the above conditions relating to the EUV reflectivity, the reflective layer 20 in the present invention is constituted, from the substrate 10 side, by a second multilayer reflective film 22, an adjustment layer 23 and a first multilayer reflective film 21.

The first multilayer reflective film 21 has a Mo layer and a Si layer alternately stacked plural times and mainly contributes to realize a high EUV reflectivity when light ray in the EUV light wavelength range is applied to the surface of the reflective layer 20. With the first multilayer reflective film 21, by increasing the number of stacking times, it is possible to increase the reflectivity, while the half-value width of the reflection spectrum and the incident angle range wherein the high EUV reflectivity can be realized, tend to decrease.

The first multilayer reflective film 21 is preferably such that the first cycle length $d_1$ being the total thickness of one set of adjacent Mo layer and Si layer is in a relation of 6.8 nm≤$d_1$≤7.2 nm, and the ratio of the thickness of a Mo layer to the first cycle length $d_1$ is in a relation of from 0.25 to 0.55.

In order to realize the high EUV reflectivity, it is necessary to bring $d_1$ and the ratio of the thickness of a Mo layer to $d_1$ to be within the above ranges.

If $d_1$ is less than 6.8 nm, it becomes problematic that the wavelength range having a high reflectivity tends to be lower than the lower limit of the wavelength range of EUV light i.e. lower than 13.5-0.3 nm.

On the other hand, if $d_1$ exceeds 7.2 nm, it becomes problematic that the wavelength range having a high reflectivity tends to be higher than the upper limit of the wavelength range of EUV light i.e. higher than 13.5+0.3 nm.

Further, if the ratio of the thickness of a Mo layer to $d_1$ is less than 0.25, a mixed layer of Mo and Si to be formed at the interface between the Mo layer and the Si layer tends to be thick, and the refractive index change tends to be gradual, such being problematic in that the reflectivity tends to be low.

On the other hand, if the ratio of the thickness of a Mo layer to $d_1$ exceeds 0.55, it becomes problematic that the reflectivity tends to be low since Mo has a larger extinction coefficient than Si.

Here, the ratio of the thickness of a Mo layer to $d_1$ is preferably from 0.3 to 0.5, more preferably from 0.35 to 0.45.

In the first multilayer reflective film 21, a Mo layer and a Si layer are stacked in from 20 to 36 sets. Hereinafter, in this specification, the number of sets means the number of repeating units of a Mo layer and a Si layer.

If the number of sets in the first multilayer reflective film 21 is less than 20, such is problematic in that the maximum value of the EUV reflectivity will not reach 50%.

On the other hand, if the number of sets in the first multilayer reflective film 21 exceeds 36 sets, while it is possible to increase the maximum value of the EUV reflectivity, it becomes problematic that the reflectivity distribution to a wavelength or to an incident angle tends to be narrow, whereby a high reflectivity tends to be hardly obtainable in a desired incident angle range.

In the second multilayer reflective film 22, a Mo layer and a Si layer are alternately stacked plural times, and by bringing the after-described second cycle length $d_2$ to be equal or close to $d_1$, it presents an optical influence mutually with the first multilayer reflective film 21 via the adjustment layer 23. As the thickness L of the entire adjustment layer as described later is close to the integral multiple of $d_1$, the reflected lights are mutually intensified, and as L is close to the (integer+0.5) multiple, the reflected lights are mutually weakened, thus contributing to the improvement in the incident angle dependence of the EUV reflectivity. Specifically, by letting interference take place by shifting the phase of reflected lights, the peak value of the EUV reflectivity is made to be low, and at the same time, the reflectivity of EUV light entering with wavelengths around the wavelength showing the peak value, is increased, whereby the reflectivity is made uniform in a wide wavelength range. As a result, the reflectivity is made uniform in a wide incident angle range, and the incident angle dependence of the EUV reflectivity is improved. In this specification, "improvement in the incident angle dependence of the EUV reflectivity" is used to mean the effect to reduce the fluctuation in the EUV reflectivity in a wide incident angle range, as described above.

The second multilayer reflective film 22 is preferably such that the second cycle length $d_2$ being the total thickness of one set of adjacent Mo layer and Si layer is in a relation of $0.9d_1 \leq d_2 \leq 1.1d_1$ to the above $d_1$, and the ratio of the thickness of a Mo layer to the second cycle length $d_2$ is in a relation of from 0.25 to 0.55.

Here, the reason for bringing $d_2$ to be within the above range is such that it is a range influential to some extent, although not as much as the after-described adjustment layer 23, over obtaining the desired EUV reflectivity characteristics. Further, the reason for bringing the ratio of the thickness of a Mo layer to $d_2$ to be within the above range is such that it is necessary to do so in order to realize the high EUV reflectivity.

If $d_2$ is less than $0.9d_1$, or $d_2$ exceeds $1.1d_1$, the wavelength ranges capable of reflecting against the first multilayer reflective film 21 and the second multilayer reflective film 22 will not be overlapped, and interference will not take place, such being problematic from the viewpoint of improving the incident angle dependence of the EUV reflectivity.

Accordingly, $d_2$ is preferably in a relation of $0.95d_1 \leq d_2 \leq 1.05d_1$, and more preferably $d_1$ and $d_2$ are substantially equal.

Further, if the ratio of the thickness of a Mo layer to $d_2$ is less than 0.25, a mixed layer of Mo and Si to be formed at the interface between the Mo layer and the Si layer tends to be thick, and the refractive index change tends to be gradual, such being problematic in that the EUV reflectivity tends to be low.

On the other hand, if the ratio of the thickness of a Mo layer to $d_2$ exceeds 0.55, it becomes problematic that the reflectivity tends to be low since Mo has a larger extinction coefficient than Si.

Here, the ratio of the thickness of a Mo layer to $d_2$ is preferably from 0.3 to 0.5, more preferably from 0.35 to 0.45.

In the second multilayer reflective film 22, a Mo layer and a Si layer are stacked in from 3 to 31 sets.

If the number of sets in the second multilayer reflective film 22 is less than 3, such is problematic in that the reflectivity tends to be non-uniform i.e. the effect to improve (reduce) the incident angle dependence of the EUV reflectivity will be inadequate.

On the other hand, if the number of sets in the second multilayer reflective film 22 exceeds 31 sets, it becomes problematic that the peak value of the EUV reflectivity tends to be excessively lowered.

In the adjustment layer 23, a Mo layer and a Si layer are alternately stacked in at least one set, whereby it contributes to the improvement in the incident angle dependence of the EUV reflectivity and to the reduction of the film stress in the reflective layer 20.

When as a conventional reflective layer with NA of 0.33, typically a 40 sets Mo/Si multilayer reflective film is formed by an ion beam sputtering method using Ar as a sputtering gas, the absolute value of the film stress thereby generated will exceed 450 MPa. Therefore, the reflective layer-coated substrate 1 for EUVL of the present invention is one constructed so that at least the absolute value of the film stress in the reflective layer 20 will be at most 450 MPa.

In a mask blank for EUVL prepared by using the reflective layer-coated substrate 1 for EUVL, in addition to the reflective layer 20, various functional films including an absorber layer are formed, and among them, the reflective layer 20 tends to contribute to the degree of the film stress of the entire mask blank for EUVL. Accordingly, by reducing the film stress of the reflective layer 20, improvement in the flatness of the entire mask blank for EUVL can be expected.

In the reflective layer-coated substrate 1 for EUVL of the present invention, for the purpose of reducing the film stress caused in the reflective layer 20, the absolute value of the film stress is preferably at most 440 MPa, more preferably at most 430 MPa. Here, if attention is paid only to reducing the absolute value of the film stress, based on the construction of the Mo/Si multilayer reflection mirror disclosed in Patent Document 2, it may be possible to accomplish e.g. at most 430 MPa. However, for example, by combining the construction of the present invention on the basis of the construction of Patent Document 2, it is possible to accomplish a further stress reduction.

The adjustment layer 23 is preferably such that the total thickness $d_3$ of adjacent Mo layer and Si layer satisfies $d_3 \leq 0.8d_1$ or $1.2d_1 \leq d_3$ to the above $d_1$, and the thickness L of the entire adjustment layer 23 satisfies a relation of $(0.3+i)d_1 \leq L \leq (0.7+i)d_1$ to the above $d_1$, wherein i is an integer greater than or equal to 0. Here, the total thickness $d_3$ of adjacent Mo layer and Si layer will be referred to also as the third cycle length, and when the number of repeating units in the third cycle length is 1, $d_3=L$.

The reason for bringing $d_3$ and L to be within the above ranges is such that it is necessary to do so for improvement in the incident angle dependence of the EUV reflectivity and for reduction of the film stress in the reflection layer 20.

If $d_3$ is $0.8d_1 < d_3 < 1.2d_1$, such is problematic in that the adjustment layer 23 itself tends to have a wavelength characteristic to interfere with the first multilayer reflective film 21, whereby the desired reflectivity characteristics tend to be hardly obtainable.

Here, $d_3$ satisfies preferably $d_3 \leq 0.75d_1$ or $1.25d_1 \leq d_3$, more preferably $d_3 \leq 0.7d_1$ or $1.3d_1 \leq d_3$.

If L is $L<(0.3+i)d_1$ or $L>(0.7+i)d_1$, such is problematic in that it is thereby not possible to impart a proper phase difference between the first multilayer reflective film 21 and the second multilayer reflective film 22.

Here, L satisfies preferably a relation of $(0.35+i)d_1 \leq L \leq (0.65+i)d_1$, more preferably a relation of $(0.4+i)d_1 \leq L \leq (0.6+i)d_1$.

In the above relational expression of $d_1$ and L, i may be optionally selected from integers greater than or equal to 0 so long as the after-mentioned condition relating to the total thickness of the reflective layer 20 is satisfied.

However, L is a numerical value to be controlled as an integral multiple of $d_3$, and if i becomes large, L tends to change largely by a small change of $d_3$, and it tends to be difficult to adjust L to a desired value, and therefore, practically i is preferably an integer greater than or equal to 0 and less than or equal to 5, more preferably an integer greater than or equal to 0 and less than or equal to 4.

In the adjustment layer 23, the ratio of the thickness of a Mo layer to the third cycle length $d_3$ is preferably from 0.25 to 0.75 with a view to reducing the film stress of the reflective layer 20.

Further, in the adjustment layer 23, the ratio of the thickness of a Mo layer to $d_3$ is preferably from 0.3 to 0.7, more preferably from 0.35 to 0.65.

In the reflective layer-coated substrate 1 for EUVL of the present invention, the total thickness of the reflective layer is at most 600 nm.

If the total thickness of the reflective layer 20 exceeds 600 nm, such is problematic in that it is thereby practically difficult to control warpage by the film stress to be at most 1 μm in a mask blank for EUVL prepared by using the reflective layer-coated substrate for EUVL of the present invention. The total thickness of the reflective layer 20 is preferably at most 400 nm, more preferably at most 300 nm. Here, the warpage of the substrate can be determined by measuring the shape by a laser interference meter and by using, as the standard plane, a virtual flat plane calculated by a least-square method from all data of the substrate surface in the measured region, calculating the difference between the positive maximum value and the negative minimum value in the measured region.

In the present invention, each layer to constitute the second multilayer reflective film 22, the adjustment layer 23 and the first multilayer reflective film 21 may be formed to have a desired thickness by means of a well-known film-forming method such as a magnetron sputtering method or an ion beam sputtering method. For example, in the case of forming the second multilayer reflective film 22, the adjustment layer 23 and the first multilayer reflective film 21 by means of an ion beam sputtering method, it is preferred that by using a Mo target as a target and an Ar gas (gas pressure: from $1.3 \times 10^{-2}$ Pa to $2.7 \times 10^{-2}$ Pa) as a sputtering gas, a Mo layer is formed to have a predetermined thickness at an ion accelerated voltage of from 300 to 1,500 V at a film-forming rate of from 0.03 to 0.30 nm/sec, and then, using a Si target as a target and an Ar gas (gas pressure: from $1.3 \times 10^{-2}$ Pa to $2.7 \times 10^{-2}$ Pa) as a sputtering gas, a Si layer is formed to have a predetermined thickness at an ion accelerated voltage of from 300 to 1,500 V at a film-forming rate of from 0.03 to 0.30 nm/sec. Taking this as one cycle (set), the Mo layer and the Si layer are staked in the predetermined number of sets with respect to the respective components to constitute the reflective layer 20, to form the second multilayer reflective film 22, the adjustment layer 23 and the first multilayer reflective film 21.

Now, other constituting elements of the reflective layer-coated substrate 1 for EUVL of the present invention will be described below.

The substrate 10 is required to satisfy the properties as a substrate for a mask blank for EUVL.

Therefore, the substrate 10 is preferably one which has a low thermal expansion coefficient (preferably $0\pm1.0\times10^{-7}$/° C., more preferably $0\pm0.3\times10^{-7}$/° C., further preferably $0\pm0.2\times10^{-7}$/° C., still further preferably $0\pm0.1\times10^{-7}$/° C., particularly preferably $0\pm0.05\times10^{-7}$/° C.) and which is excellent in smoothness, planarity and durability against a cleaning liquid to be used for e.g. cleaning of a mask blank or a photomask after forming a pattern. As the substrate 10, specifically, glass having a low thermal expansion coefficient, e.g. $SiO_2$—$TiO_2$ type glass, may be used. However, the substrate is not limited thereto, and it is possible to employ a substrate of e.g. crystallized glass having β-quartz solid solution precipitated, quartz glass, silicon or metal. Further, a film such as a stress-correcting film may be formed on the substrate 10.

The substrate 10 preferably has a smooth surface having a surface roughness of at most 0.15 nm rms and a planarity of at most 100 nm, whereby a high reflectivity and transfer precision can be attained by a photomask after forming a pattern.

The size, thickness, etc. of the substrate 10 are suitably determined depending upon e.g. the designed values for the mask. In Examples given hereinafter, a $SiO_2$—$TiO_2$ type glass having a size of 6 inch (152.4 mm) square and a thickness of 0.25 inch (6.3 mm) was used.

It is preferred that no defect is present on the film-forming surface i.e. the surface of the substrate 10 on the side where a reflective layer 20 is to be formed. However, even in a case where a defect is present, in order not to cause a phase defect due to a concave defect and/or a convex defect, it is preferred that the depth of a concave defect or the height of a convex defect is not more than 2 nm, and the half value width of such a concave defect or convex defect is not more than 60 nm.

Now, the mask blank for EUVL of the present invention will be described.

Figure 2:
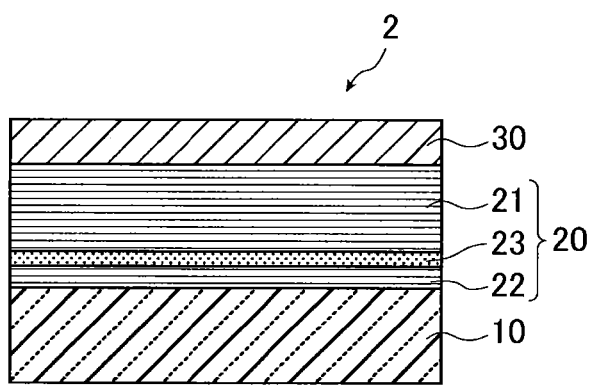
FIG. 2 is a schematic cross-sectional view illustrating an embodiment of the mask blank for EUVL of the present invention.

FIG. 2 is a schematic cross-sectional view illustrating an embodiment of the mask blank for EUVL of the present invention.

As is evident from the Fig., the mask blank 2 for EUVL of the present invention is one wherein an absorber layer 30 for absorbing EUV light is formed on the reflective layer 20 in the reflective layer-coated substrate 1 for EUVL of the present invention shown in FIG. 1.

The property particularly required for the absorber layer 30 is that the EUV reflectivity is very low. Specifically, when the surface of the absorber layer 30 is irradiated with light ray within a wavelength region of EUV light, the maximum reflectivity in the vicinity of a wavelength of 13.5 nm is preferably at most 0.5%, more preferably at most 0.1%.

In order to attain such a property, it is preferably constituted by a material having a high absorption coefficient of EUV light, and it is preferably a layer containing at least Ta and N.

As the layer containing Ta and N, it is preferred to use one member selected from the group consisting of TaN, TaNH, TaBN, TaGaN, TaGeN, TaSiN, TaBSiN and PdTaN. Examples of preferred compositions of such absorber layers are as follows.

TaN Layer

Content of Ta: preferably from 30 to 90 at %, more preferably from 40 to 80 at %, further preferably from 40 to 70 at %, particularly preferably from 50 to 70 at %

Content of N: preferably from 10 to 70 at %, more preferably from 20 to 60 at %, further preferably from 30 to 60 at %, particularly preferably from 30 to 50 at %

TaNH Layer

Total content of Ta and N: preferably from 50 to 99.9 at %, more preferably from 90 to 98 at %, further preferably from 95 to 98 at %

Content of H: preferably from 0.1 to 50 at %, more preferably from 2 to 10 at %, further preferably from 2 to 5 at %

Composition ratio of Ta to N (Ta:N): preferably from 9:1 to 3:7, more preferably from 7:3 to 4:6, further preferably from 7:3 to 5:5

TaBN Layer

Total content of Ta and N: preferably from 75 to 95 at %, more preferably from 85 to 95 at %, further preferably from 90 to 95 at %

Content of B: preferably from 5 to 25 at %, more preferably from 5 to 15 at %, further preferably from 5 to 10 at %

Composition ratio of Ta to N (Ta:N): preferably from 9:1 to 3:7, more preferably from 7:3 to 4:6, further preferably from 7:3 to 5:5

TaBSiN layer

Content of B: at least 1 at % and less than 5 at %, preferably from 1 to 4.5 at %, more preferably from 1.5 to 4 at %

Content of Si: from 1 to 25 at %, preferably from 1 to 20 at %, more preferably from 2 to 12 at %

Composition ratio of Ta to N (Ta:N): from 8:1 to 1:1

Content of Ta: preferably from 50 to 90 at %, more preferably from 60 to 80 at %

Content of N: preferably from 5 to 30 at %, more preferably from 10 to 25 at %

PdTaN Layer

Total content of Ta and N: preferably from 30 to 80 at %, more preferably from 30 to 75 at %, further preferably from 30 to 70 at %

Content of Pd: preferably from 20 to 70 at %, more preferably from 25 to 70 at %, further preferably from 30 to 70 at % Composition ratio of Ta to N (Ta:N): preferably from 1:7 to 3:1, more preferably from 1:3 to 3:1, further preferably from 3:5 to 3:1

Further, the thickness of the absorber layer 30 is preferably in a range of from 30 to 100 nm. The absorber layer 30 of the present invention can be formed by using a film forming method such as a sputtering method, such as a magnetron sputtering method or an ion beam sputtering method.

In the mask blank 2 for EUVL of the present invention, a protective layer (not shown) for protecting the reflective layer 20 during the formation of a pattern in the absorber layer 30, may be formed between the reflective layer 20 and the absorber layer 30.

Such a protective layer is provided for the purpose of protecting the reflective layer 20, so that at the time of forming a pattern in the absorber layer 30 by an etching process, specifically by a dry etching process using a chlorine-type gas as the etching gas, the reflective layer 20 will not be damaged by the etching process. Accordingly, as the material for the protective layer, a material hardly susceptible to an influence by the etching process of the absorber layer 30 i.e. having an etching rate slower than the absorber layer 30 and yet being hardly susceptible to damage by such an etching process, is selected for use.

Further, the protective layer is preferably such that the protective layer itself also has a high EUV reflectivity in order not to impair the EUV reflectivity at the reflective layer 20 even after forming the protective layer.

As a protective layer to satisfy the above conditions, a Ru layer or a Ru compound layer may, for example, be formed. Such a Ru compound layer is preferably made of at least one member selected from the group consisting of RuB, RuNb and RuZr. In a case where the protective layer is a Ru compound layer, the content of Ru is preferably at least 50 at %, more preferably at least 80 at %, particularly preferably at least 90 at %. However, in a case where the protective layer is a RuNb layer, the content of Nb in the protective layer is preferably from 5 to 40 at %, particularly preferably from 5 to 30 at %.

The thickness of the protective layer is preferably in a range of from 1 to 10 nm, whereby the EUV reflectivity can be increased and an etching resistant characteristic can be obtained. The thickness of the protective layer is more preferably in a range of from 1 to 5 nm, further preferably in a range of from 2 to 4 nm.

The protective layer may be formed by means of a well-known film forming method such as a magnetron sputtering method or an ion beam sputtering method.

In a case where a Ru layer is formed as the protective layer by means of an ion beam sputtering method, discharge may be made in an argon (Ar) atmosphere by using a Ru target as the target.

Specifically, the ion beam sputtering may be carried out under the following conditions.

Sputtering gas: Ar (gas pressure: from $1.3\times10^{-2}$ Pa to $2.7\times10^{-2}$ Pa)

Ion accelerating voltage: from 300 to 1,500 V

Film forming rate: from 0.03 to 0.30 nm/sec

In the mask blank 2 for EUVL of the present invention, a low reflective layer (not shown) to an inspection light to be used for inspection of a mask pattern may be formed on the absorber layer 30.

At the time of preparing an EUV mask, after forming a pattern in the absorber layer, an inspection is conducted to see if the pattern is formed as designed. In such an inspection of a mask pattern, an inspecting machine may be used wherein light having a wavelength of about 257 nm is used as the inspection light. That is, the inspection is made by a difference in the reflectivity of such light having a wavelength of about 257 nm, specifically by the difference in the reflectivity between the surface exposed by removal of the absorber layer 30 by the formation of a pattern and the surface of the absorber layer 30 remained without being removed by the formation of the pattern. Here, the former is the surface of the reflective layer 20 or the surface of a protective layer, if such a protective layer is formed on the reflective layer 20. Therefore, if the difference in the reflectivity between the surface of the reflective layer 20 (or the protective layer if the protective layer is formed on the reflective layer 20) and the surface of the absorber layer 30 to the wavelength of the inspection light is small, the contrast at the time of the inspection becomes poor, and an accurate inspection may not be done.

The absorber layer 30 in the present invention has a very low EUV reflectivity and has an excellent property as an absorber layer for a mask blank for EUVL, but when viewed with respect to the wavelength of the inspection light, the reflectivity may not be necessarily sufficiently low. As a result, the difference between the reflectivity at the surface of the absorber layer 30 and the reflectivity at the surface of the reflective layer 20 (or the protective layer if the protective layer is formed on the reflective layer 20) at the wavelength of the inspection light tends to be small, and the contrast at the time of the inspection may not sufficiently be obtainable. If the contrast at the time of the inspection cannot be sufficiently obtained, a defect in a pattern cannot sufficiently be detected in the inspection of a mask, and an adequate inspection of a defect may not be carried out.

Therefore, by forming a low reflective layer on the absorber layer 30, the contrast at the time of the inspection will be good. In other words, the reflectivity at a wavelength of the inspection light becomes very low. When irradiated with light ray within the wavelength region of the inspection light, the low reflective layer formed for such a purpose preferably has the maximum reflectivity at the wavelength of the inspection light being at most 15%, more preferably at most 10%, further preferably at most 5%.

When the reflectivity at the wavelength of the inspection light at the low reflective layer is at most 15%, the contrast at the time of the inspection is good. Specifically, the contrast between reflected light with a wavelength of the inspection light at the surface of the reflective layer 20 (or the protective layer if the protective layer is formed on the reflective layer 20) and reflected light with the wavelength of the inspection light at the surface of the low reflective layer becomes at least 40%.

In this specification, the contrast can be obtained by using the following formula.

$$\text{Contrast}(\%) = ((R_2 - R_1)/(R_2 + R_1)) \times 100$$

Here, at the wavelength of the inspection light, $R_2$ is the reflectivity at the surface of the reflective layer 20 (or the protective layer if the protective layer is formed on the reflective layer 20), and $R_1$ is the reflectivity at the surface of the absorber layer 30 (or the low reflective layer if the low reflective layer is formed on the absorber layer 30).

In the present invention, the contrast represented by the above formula is more preferably at least 45%, further preferably at least 60%, particularly preferably at least 80%.

To attain the above-described properties, the low reflective layer is preferably constituted by a material having a refractive index lower than the absorber layer 30 at the wavelength of the inspection light.

As a specific example of such a low reflective layer, a layer containing Ta and oxygen as the main components is preferred, and particularly, a layer containing TaON, TaBON or TaGeON as the main component may be exemplified. As another example, one containing Ta, B, Si and oxygen (O) in the following ratio (low reflective layer (TaBSiO)) may be mentioned.

Content of B: at least 1 at % and less than 5 at %, preferably from 1 to 4.5 at %, more preferably from 1.5 to 4 at %.

Content of Si: from 1 to 25 at %, preferably from 1 to 20 at %, more preferably from 2 to 10 at %.

Composition ratio of Ta to O (Ta:O): from 7:2 to 1:2, preferably from 7:2 to 1:1, more preferably from 2:1 to 1:1.

Further, as a specific example for the low reflective layer, one containing Ta, B, Si, O and N in the following ratio (low reflective layer (TaBSiON)) may be mentioned.

Content of B: at least 1 at % and less than 5 at %, preferably from 1 to 4.5 at %, more preferably from 2 to 4.0 at %.

Content of Si: from 1 to 25 at %, preferably from 1 to 20 at %, more preferably from 2 to 10 at %.

Composition ratio of Ta to O and N (Ta:(O+N)): from 7:2 to 1:2, preferably from 7:2 to 1:1, more preferably from 2:1 to 1:1.

Further, as another example for the low reflective layer, the material may be one containing at least Ta, O and H. And, a specific example containing at least Ta, O and H may be a TaOH film, a TaONH film containing Ta, O, N and H, a TaBONH film containing Ta, B, O, N and H, a TaBSiOH film containing Ta, B, Si, O and H, a TaBSiONH film containing Ta, B, Si, O, N and H, or a TaGeONH film containing Ta, Ge, O, N and H.

In a case where the low reflective layer is formed on the absorber layer 30, the total thickness of the absorber layer 30 and the low reflective layer is preferably in a range of from 35 to 130 nm. Further, if the thickness of the low reflective layer is more than the thickness of the absorber layer 30, the EUV light absorbing property at the absorber layer 30 is likely to be low, and therefore, the thickness of the low reflective layer is preferably less than the thickness of the absorber layer 30. For this purpose, the thickness of the low reflective layer is preferably in a range of from 5 to 30 nm, more preferably in a range of from 10 to 20 nm.

The low reflective layer may be formed by using a film forming method such as a sputtering method, such as a magnetron sputtering method or an ion beam sputtering method.

Here, the reason as to why it is preferred to form a low reflective layer on the absorber layer 30, is that the wavelength of the inspection light for a pattern is different from the wavelength of EUV light. Therefore, in a case where EUV light (in the vicinity of 13.5 nm) is used as the inspection light for a pattern, it is considered unnecessary to form a low reflective layer on the absorber layer 30. The wavelength of the inspection light tends to shift toward a low wavelength side as the size of a pattern becomes small, and in future, it is considered to be shifted to 193 nm or further to 13.5 nm. In the case where the wavelength of the inspection light is 13.5 nm, it is considered unnecessary to form a low reflective layer on the absorber layer 30.

The mask blank 2 for EUVL of the present invention may have a functional film known in the field of mask blanks for EUVL, in addition to the above-described film construction i.e. the second multilayer reflective film 22, the adjustment layer 23 and the first multilayer film 21 constituting the reflective layer 20, the absorber layer 30, and optional elements such as the protective layer and the low reflective layer. A specific example of such a functional film may, for example, be an electrically conductive coating formed on the rear side of the substrate to promote the electrostatic chucking of the substrate, as disclosed in e.g. JP-A-2003-501823. Here, the rear side of the substrate means the surface on the opposite side to the side where the reflective layer 20 is formed, in the substrate 10 in FIG. 2. For the electrically conductive coating to be formed on the rear side of the substrate for such a purpose, the electrical conductivity and the thickness of the constituting material are selected so that the sheet resistance will be at most 100Ω/□. The constituting material of the electrically conductive coating may be selected widely from those disclosed in known literatures. For example, an electrically conductive coating disclosed in JP-A-2003-501823, specifically a coating comprising silicon, TiN, molybdenum, chromium and TaSi may be applied. The thickness of the electrically conductive coating may, for example, be in a range of from 10 to 1,000 nm.

The electrically conductive coating may be formed by means of a known film-forming method, e.g. a sputtering method such as a magnetron sputtering method or an ion beam sputtering method, a CVD method, a vacuum vapor deposition method or an electroplating method.

A reflective mask for EUV lithography may be produced by patterning at least the absorber layer 30 (in a case where a low reflective layer is formed on the absorber layer 30, the absorber layer and the low reflective layer) of the mask blank 2 for EUVL of the present invention. The method for patterning the absorber layer 30 (in a case where a low reflective layer is formed on the absorber layer 30, the absorber layer 30 and the low reflective layer), is not particularly limited. For example, a method may be employed wherein a resist is applied on the absorber layer 30 (in a case where a low reflective layer is formed on the absorber layer 30, the absorber layer 30 and the low reflective layer) to form a resist pattern, and by using it as a mask, the absorber layer 30 (in a case where a low reflective layer is formed on the absorber layer 30, the absorber layer 30 and the low reflective layer) is subjected to etching. The material for the resist, or the drawing method for the resist pattern may suitably be selected in consideration of e.g. the material of the absorber layer 30 (in a case where a low reflective layer is formed on the absorber layer 30, the absorber layer 30 and the low reflective layer). As the method for etching the absorber layer 30 (in a case where a low reflective layer is formed on the absorber layer 30, the absorber layer 30 and the low reflective layer), dry etching using a chlorine-type gas as the etching gas may be employed. After patterning the absorber layer 30 (in a case where a low reflective layer is formed on the absorber layer 30, the absorber layer 30 and the low reflective layer), the resist is removed by a remover liquid to obtain a reflective mask for EUV lithography (EUV mask).

A process for producing a semiconductor integrated circuit using the EUV mask obtainable by the above procedure will be described. This method may be applied to a process for producing a semiconductor integrated circuit by means of a photolithography method using EUV light as the light source for exposure. Specifically, a substrate such as a silicon wafer coated with a resist is disposed on a stage, and the above EUV mask is set on a reflective exposure apparatus combined with a reflective mirror. And, EUV light from a light source is applied to the EUV mask via the reflective mirror to have the EUV light reflected by the EUV mask and applied to the substrate coated with the resist. By such a pattern transfer step, a circuit pattern is transferred to the substrate. The substrate having a circuit pattern transferred thereto is subjected to etching of sensitized or non-sensitized portions by development, followed by peeling of the resist. A semiconductor integrated circuit is produced by repeating such a process.

EXAMPLES

Now, the present invention will be described in further detail with reference to Examples.

Example 1

In this Example, a reflective layer-coated substrate 1 for EUVL as shown in FIG. 1 was prepared.

As a substrate 10 for film formation, a $SiO_2$—$TiO_2$ type glass substrate (size: 6 inches (152.4 mm) square, thickness: 6.3 mm) was used. The thermal expansion coefficient of this glass substrate was $0.05 \times 10^7 /°$ C., the Young's modulus was 67 GPa, the Poisson ratio was 0.17, and the specific rigidity was $3.07 \times 10^7 \, m^2/s^2$. This glass substrate was polished to form a smooth surface having a surface roughness rms of at most 0.15 nm and a planarity of at most 100 nm on the main surface side on which a reflective layer was to be formed.

On the rear surface side of the substrate 10, a Cr film having a thickness of 100 nm was formed by a magnetron sputtering method to provide an electrically conductive coating (not shown in the drawings) having a sheet resistance of 100Ω/□.

By using the formed Cr film, the substrate 10 (size: 6 inches (152.4 mm) square, thickness: 6.3 mm) was fixed to a usual electrostatic chuck of a flat plate shape, and on the surface of the substrate 10, a Mo layer and then a Si layer were alternately formed by means of an ion beam sputtering method repeatedly in the predetermined number of sets to form a second multilayer reflective film 22, an adjustment layer 23 and a first multilayer reflective film 21 (as shown blow) constituting a reflective layer 20.

The film forming conditions for the Mo layer and the Si layer are as follows.

(Film Forming Conditions for Mo Layer)
    Target: Mo target
    Sputtering gas: Ar gas (gas pressure: 0.02 Pa)
    Voltage: 700 V
    Film forming rate: 0.064 nm/sec (Film Forming Conditions for Si Layer)
    Target: Si target (boron-doped)
    Sputtering gas: Ar gas (gas pressure: 0.02 Pa)
    Voltage: 700 V
    Film forming rate: 0.077 nm/sec Second Multilayer Reflective Film 22
    Mo layer: 3 nm
    Si layer: 4 nm Second cycle length $d_2$: 7 nm ($0.9d_1 \leq d_2 \leq 1.1d_1$ is satisfied.)
Mo layer/$d_2$: 0.43 (from 0.25 to 0.55 is satisfied.)
Number of sets: 10 (from 3 to 31 sets is satisfied.)
Total thickness: 70 nm
Adjustment Layer 23
Mo layer: 1.6 nm
Si layer: 2.4 nm
Third cycle length $d_3$: 4 nm ($d_3 \leq 0.8d_1$ is satisfied.)
Mo layer/$d_3$: 0.4 (from 0.3 to 0.7 is satisfied.)
Number of sets: 8
Total thickness L: 32 nm (as i=4, $(0.3+4)d_1 \leq L \leq (0.7+4)d_1$ is satisfied.)
First Multilayer Reflective Film 21
Mo layer: 3 nm
Si layer: 4 nm
First cycle length $d_1$: 7 nm (6.8 nm $\leq d_1 \leq$ 7.2 nm is satisfied.)
Mo layer/$d_1$: 0.43 (from 0.25 to 0.55 is satisfied.)
Number of sets: 30 (from 20 to 36 sets is satisfied.)
Total thickness: 210 nm
Reflective Layer 20
Total thickness: 312 nm (at most 600 nm is satisfied.)
With respect to the prepared reflective layer-coated substrate 1 for EUVL, the calculation of the EUV reflectivity and the measurement of the film stress of the reflective layer 20 by means of FLX-2320 thin film stress measuring apparatus manufactured by KLA-TENCOR, were carried out. Here, in the film stress measurement, the measurement was carried out with respect to a sample having a silicon wafer bonded on the glass substrate.

As a result, the peak value of the EUV reflectivity was 69.2%, $R_{min}$ was 64.0%, the absolute value ($\Delta R$) of the fluctuation range of the EUV reflectivity was 5.2%, and the fluctuation range based on $R_{min}$ ($\Delta R/R_{min}$) was 8.3%, and thus, the result satisfied within $R_{min} \times \frac{1}{10}$.

Further, the film stress of the reflective layer 20 was −408 MPa (the absolute value of the film stress being at most 450 MPa is satisfied.).

Example 2

This Example was carried out in the same manner as in Example 1 except that the second multilayer reflective film 22, the adjustment layer 23 and the first multilayer reflective film 21 were as follows.
Second Multilayer Reflective Film 22
Mo layer: 3 nm
Si layer: 4 nm
Second cycle length $d_2$: 7 nm ($0.9d_1 \leq d_2 \leq 1.1d_1$ is satisfied.)
Mo layer/$d_2$: 0.43 (from 0.25 to 0.55 is satisfied.)
Number of sets: 10 (from 3 to 31 sets is satisfied.)
Total thickness: 70 nm
Adjustment Layer 23
Mo layer: 2.4 nm
Si layer: 1.6 nm
Third cycle length $d_3$: 4 nm ($d_3 \leq 0.8d_1$ is satisfied.)
Mo layer/$d_3$: 0.6 (from 0.3 to 0.7 is satisfied.)
Number of sets: 8
Total thickness L: 32 nm (as i=4, $(0.3+4)d_1 \leq L \leq (0.7+4)d_1$ is satisfied.)
First Multilayer Reflective Film 21
Mo layer: 3 nm
Si layer: 4 nm
First cycle length $d_1$: 7 nm (6.8 nm $\leq d_1 \leq$ 7.2 nm is satisfied.)
Mo layer/$d_1$: 0.43 (from 0.25 to 0.55 is satisfied.)
Number of sets: 30 (from 20 to 36 sets is satisfied.)
Total thickness: 210 nm
Reflective Layer 20
Total thickness: 312 nm (at most 600 nm is satisfied.)
With respect to the prepared reflective layer-coated substrate 1 for EUVL, the calculation of the EUV reflectivity was carried out in the same manner as in Example 1.

As a result, the peak value of the EUV reflectivity was 68.7%, $R_{min}$ was 62.9%, the absolute value ($\Delta R$) of the fluctuation range of the EUV reflectivity was 5.8%, and the fluctuation range based on $R_{min}$ ($\Delta R/R_{min}$) was 9.2%, and thus, the result satisfied within $R_{min} \times \frac{1}{10}$.

Further, the film stress of the reflective layer 20 was −380 MPa (the absolute value of the film stress being at most 450 MPa is satisfied.).

Example 3

This Example was carried out in the same manner as in Example 1 except that the second multilayer reflective film 22, the adjustment layer 23 and the first multilayer reflective film 21 were as follows.
Second Multilayer Reflective Film 22
Mo layer: 3 nm
Si layer: 4 nm
Second cycle length $d_2$: 7 nm ($0.9d_1 \leq d_2 \leq 1.1d_1$ is satisfied.)
Mo layer/$d_2$: 0.43 (from 0.25 to 0.55 is satisfied.)
Number of sets: 10 (from 3 to 31 sets is satisfied.)
Total thickness: 70 nm
Adjustment Layer 23
Mo layer: 1.6 nm
Si layer: 2.4 nm
Third cycle length $d_3$: 4 nm ($d_3 \leq 0.8d_1$ is satisfied.)
Mo layer/$d_3$: 0.4 (from 0.3 to 0.7 is satisfied.)
Number of sets: 1
Total thickness L: 4 nm (as i=0, $(0.3+0)d_1 \leq L \leq (0.7+0)d_1$ is satisfied.)
First multilayer reflective film 21
Mo layer: 3 nm
Si layer: 4 nm
First cycle length $d_1$: 7 nm (6.8 nm $\leq d_1 \leq$ 7.2 nm is satisfied.)
Mo layer/$d_1$: 0.43 (from 0.25 to 0.55 is satisfied.)
Number of sets: 30 (from 20 to 36 sets is satisfied.)
Total thickness: 210 nm
Reflective Layer 20
Total thickness: 284 nm (at most 600 nm is satisfied.)
With respect to the prepared reflective layer-coated substrate 1 for EUVL, the calculation of the EUV reflectivity was carried out in the same manner as in Example 1.

As a result, the peak value of the EUV reflectivity was 69.0%, $R_{min}$ was 64.1%, the absolute value ($\Delta R$) of the fluctuation range of the EUV reflectivity was 4.9%, and the fluctuation range based on $R_{min}$ ($\Delta R/R_{min}$) was 7.6%, and thus, the result satisfied within $R_{min} \times \frac{1}{10}$.

Further, the film stress of the reflective layer 20 was −412 MPa (the absolute value of the film stress being at most 450 MPa is satisfied.).

Comparative Example 1

This Example was carried out in the same manner as in Example 1 except that the second multilayer reflective film 22 was as follows, and the adjustment layer 23 and the first multilayer reflective film 21 were not formed.
Second Multilayer Reflective Film 22
Mo layer: 3 nm
Si layer: 4 nm
Second cycle length $d_2$: 7 nm ($0.9d_1 \leq d_2 \leq 1.1d_1$ is satisfied.)
Mo layer/$d_2$: 0.43 (from 0.25 to 0.55 is satisfied.)
Number of sets: 40 (from 3 to 31 sets is satisfied.)
Total thickness: 280 nm Reflective Layer 20
    Total thickness: 280 nm (at most 600 nm is satisfied.)
    With respect to the prepared reflective layer-coated substrate 1 for EUVL, the calculation of the EUV reflectivity was carried out in the same manner as in Example 1.
    As a result, the peak value of the EUV reflectivity was 72.9%, $R_{min}$ was 61.3%, the absolute value ($\Delta R$) of the fluctuation range of the EUV reflectivity was 11.6%, and the fluctuation range based on $R_{min}$ ($\Delta R/R_{min}$) was 18.9%, and thus, the result did not satisfy within $R_{min} \times 1/10$.
    Further, the film stress of the reflective layer 20 was −450 MPa (the absolute value of the film stress being at most 450 MPa is satisfied.).

Comparative Example 2

This Example was carried out in the same manner as in Example 1 except that the second multilayer reflective film 22 and the first multilayer reflective film 21 were as follows, and as the adjustment layer 23, a Si layer having a thickness of 32 nm (single layer) was formed.
Second Multilayer Reflective Film 22
    Mo layer: 3 nm
    Si layer: 4 nm
    Second cycle length $d_2$: 7 nm ($0.9d_1 \le d_2 \le 1.1d_1$ is satisfied.)
    Mo layer/$d_2$: 0.43 (from 0.25 to 0.55 is satisfied.)
    Number of sets: 10 (from 3 to 31 sets is satisfied.)
    Total thickness: 70 nm
Adjustment Layer 23
    Si layer: 32 nm
    Third cycle length $d_3$: 32 nm ($1.2d_1 \le d_3$ is satisfied.)
    Mo layer/$d_3$: 0 (from 0.3 to 0.7 is not satisfied.)
    Number of sets: 1
    Total thickness L: 32 nm (as i=4, $(0.3+4)d_1 \le L \le (0.7+4)d_1$ is satisfied.)
First Multilayer Reflective Film 21
    Mo layer: 3 nm
    Si layer: 4 nm
    First cycle length $d_1$: 7 nm ($6.8 \text{ nm} \le d_1 \le 7.2 \text{ nm}$ is satisfied.)
    Mo layer/$d_1$: 0.43 (from 0.25 to 0.55 is satisfied.)
    Number of sets: 30 (from 20 to 36 sets is satisfied.)
    Total thickness: 210 nm
Reflective Layer 20
    Total thickness: 312 nm (at most 600 nm is satisfied.)
    With respect to the prepared reflective layer-coated substrate 1 for EUVL, the calculation of the EUV reflectivity was carried out in the same manner as in Example 1.
    As a result, the peak value of the EUV reflectivity was 69.0%, $R_{min}$ was 64.1%, the absolute value ($\Delta R$) of the fluctuation range of the EUV reflectivity was 4.9%, and the fluctuation range based on $R_{min}$ ($\Delta R/R_{min}$) was 7.6%, and thus, the result satisfied within $R_{min} \times 1/10$.
    On the other hand, the film stress of the reflective layer 20 was −486 MPa, and thus, the result did not satisfy the absolute value of the film stress being at most 450 MPa.

Comparative Example 3

This Example was carried out in the same manner as in Example 1 except that the second multilayer reflective film 22 and the first multilayer reflective film 21 were as follows, and as the adjustment layer 23, a Mo layer having a thickness of 32 nm was formed.
Second Multilayer Reflective Film 22
    Mo layer: 3 nm
    Si layer: 4 nm
    Second cycle length $d_2$: 7 nm ($0.9d_1 \le d_2 \le 1.1d_1$ is satisfied.)
    Mo layer/$d_2$: 0.43 (from 0.25 to 0.55 is satisfied.)
    Number of sets: 10 (from 3 to 31 sets is satisfied.)
    Total thickness: 70 nm
Adjustment Layer 23
    Mo layer: 32 nm
    Third cycle length $d_3$: 32 nm ($1.2d_1 \le d_3$ is satisfied.)
    Mo layer/$d_3$: 1 (from 0.3 to 0.7 is not satisfied.)
    Number of sets: 1
    Total thickness L: 32 nm (as i=4, $(0.3+4)d_1 \le L \le (0.7+4)d_1$ is satisfied.)
First Multilayer Reflective Film 21
    Mo layer: 3 nm
    Si layer: 4 nm
    First cycle length $d_1$: 7 nm ($6.8 \text{ nm} \le d_1 \le 7.2 \text{ nm}$ is satisfied.)
    Mo layer/$d_1$: 0.43 (from 0.25 to 0.55 is satisfied.)
    Number of sets: 30 (from 20 to 36 sets is satisfied.)
    Total thickness: 210 nm
Reflective Layer 20
    Total thickness: 312 nm (at most 600 nm is satisfied.)
    With respect to the prepared reflective layer-coated substrate 1 for EUVL, the calculation of the EUV reflectivity was carried out in the same manner as in Example 1.
    As a result, the peak value of the EUV reflectivity was 68.5%, $R_{min}$ was 63.8%, the absolute value ($\Delta R$) of the fluctuation range of the EUV reflectivity was 4.7%, and the fluctuation range based on $R_{min}$ ($\Delta R/R_{min}$) was 7.4%, and thus, the result satisfied within $R_{min} \times 1/10$.
    On the other hand, the film stress of the reflective layer 20 was −563 MPa, and thus, the result did not satisfy the absolute value of the film stress being at most 450 MPa.

Comparative Example 4

This Example was carried out in the same manner as in Example 1 except that the second multilayer reflective film 22, the adjustment layer 23 and the first multilayer reflective film 21 were as follows.
Second Multilayer Reflective Film 22
    Mo layer: 2.8 nm
    Si layer: 3.8 nm
    Second cycle length $d_2$: 6.6 nm ($0.9d_1 \le d_2 \le 1.1d_1$ is satisfied.)
    Mo layer/$d_2$: 0.42 (from 0.25 to 0.55 is satisfied.)
    Number of sets: 10 (from 3 to 31 sets is satisfied.)
    Total thickness: 66 nm
Adjustment Layer 23
    Mo layer: 1.6 nm
    Si layer: 2.4 nm
    Third cycle length $d_3$: 4 nm ($d_3 \le 0.8d_1$ is satisfied.)
    Mo layer/$d_3$: 0.4 (from 0.3 to 0.7 is satisfied.)
    Number of sets: 1
    Total thickness L: 4 nm (as i=0, $(0.3+0)d_1 \le L \le (0.7+0)d_1$ is satisfied.)
First Multilayer Reflective Film 21
    Mo layer: 2.8 nm
    Si layer: 3.8 nm
    First cycle length $d_1$: 6.6 nm ($6.8 \text{ nm} \le d_1 \le 7.2 \text{ nm}$ is not satisfied.)
    Mo layer/$d_1$: 0.42 (from 0.25 to 0.55 is satisfied.)
    Number of sets: 30 (from 20 to 36 sets is satisfied.)
    Total thickness: 198 nm
Reflective Layer 20
    Total thickness: 268 nm (at most 600 nm is satisfied.)
    With respect to the prepared reflective layer-coated substrate 1 for EUVL, the calculation of the EUV reflectivity was carried out in the same manner as in Example 1.

As a result, the peak value of the EUV reflectivity was 22.4%, and the EUV reflectivity was less than 50%.

Comparative Example 5

This Example was carried out in the same manner as in Example 1 except that the second multilayer reflective film 22, the adjustment layer 23 and the first multilayer reflective film 21 were as follows.
Second Multilayer Reflective Film 22
  Mo layer: 3.2 nm
  Si layer: 4.2 nm
  Second cycle length $d_2$: 7.4 nm ($0.9d_1 \leq d_2 \leq 1.1d_1$ is satisfied.)
  Mo layer/$d_2$: 0.43 (from 0.25 to 0.55 is satisfied.)
  Number of sets: 10 (from 3 to 31 sets is satisfied.)
  Total thickness: 74 nm
Adjustment Layer 23
  Mo layer: 1.6 nm
  Si layer: 2.4 nm
  Third cycle length $d_3$: 4 nm ($d_3 \leq 0.8d_1$ is satisfied.)
  Mo layer/$d_3$: 0.4 (from 0.3 to 0.7 is satisfied.)
  Number of sets: 1
  Total thickness L: 4 nm ($(0.3+0)d_1 \leq L \leq (0.7+0)d_1$ is satisfied.)
First Multilayer Reflective Film 21
  Mo layer: 3.2 nm
  Si layer: 4.2 nm
  First cycle length $d_1$: 7.4 nm (6.8 nm $\leq d_1 \leq$ 7.2 nm is not satisfied.)
  Mo layer/$d_1$: 0.43 (from 0.25 to 0.55 is satisfied.)
  Number of sets: 30 (from 20 to 36 sets is satisfied.)
  Total thickness: 198 nm
Reflective Layer 20
  Total thickness: 300 nm (at most 600 nm is satisfied.)
With respect to the prepared reflective layer-coated substrate 1 for EUVL, the calculation of the EUV reflectivity was carried out in the same manner as in Example 1.

As a result, the peak value of the EUV reflectivity was 19.4%, and the EUV reflectivity was less than 50%.

Comparative Example 6

This Example was carried out in the same manner as in Example 1 except that the second multilayer reflective film 22, the adjustment layer 23 and the first multilayer reflective film 21 were as follows.
Second Multilayer Reflective Film 22
  Mo layer: 2.6 nm
  Si layer: 3.4 nm
  Second cycle length $d_2$: 6 nm ($0.9d_1 \leq d_2 \leq 1.1d_1$ is not satisfied.)
  Mo layer/$d_2$: 0.43 (from 0.25 to 0.55 is satisfied.)
  Number of sets: 10 (from 3 to 31 sets is satisfied.)
  Total thickness: 60 nm
Adjustment Layer 23
  Mo layer: 1.6 nm
  Si layer: 2.4 nm
  Third cycle length $d_3$: 4 nm ($d_3 \leq 0.8d_1$ is satisfied.)
  Mo layer/$d_3$: 0.4 (from 0.3 to 0.7 is satisfied.)
  Number of sets: 1
  Total thickness L: 4 nm (as i=0, $(0.3+0)d_1 \leq L \leq (0.7+0)d_1$ is satisfied.)
First Multilayer Reflective Film 21
  Mo layer: 3 nm
  Si layer: 4 nm
  First cycle length $d_1$: 7 nm (6.8 nm $\leq d_1 \leq$ 7.2 nm is satisfied.)
  Mo layer/$d_2$: 0.43 (from 0.25 to 0.55 is satisfied.)
  Number of sets: 30 (from 20 to 36 sets is satisfied.)
  Total thickness: 210 nm
Reflective Layer 20
  Total thickness: 274 nm (at most 600 nm is satisfied.)
With respect to the prepared reflective layer-coated substrate 1 for EUVL, the calculation of the EUV reflectivity was carried out in the same manner as in Example 1.

As a result, the peak value of the EUV reflectivity was 70.3%, $R_{min}$ was 60.5%, the absolute value ($\Delta R$) of the fluctuation range of the EUV reflectivity was 9.9%, and the fluctuation range based on $R_{min}$ ($\Delta R/R_{min}$) was 16.3%, and thus, the result did not satisfy within $R_{min} \times 1/10$.

Comparative Example 7

This Example was carried out in the same manner as in Example 1 except that the second multilayer reflective film 22, the adjustment layer 23 and the first multilayer reflective film 21 were as follows.
Second Multilayer Reflective Film 22
  Mo layer: 3.4 nm
  Si layer: 4.6 nm
  Second cycle length $d_2$: 8 nm ($0.9d_1 \leq d_2 \leq 1.1d_1$ is not satisfied.)
  Mo layer/$d_2$: 0.43 (from 0.25 to 0.55 is satisfied.)
  Number of sets: 10 (from 3 to 31 sets is satisfied.)
  Total thickness: 80 nm
Adjustment Layer 23
  Mo layer: 1.6 nm
  Si layer: 2.4 nm
  Third cycle length $d_3$: 4 nm ($d_3 \leq 0.8d_1$ is satisfied.)
  Mo layer/$d_3$: 0.4 (from 0.3 to 0.7 is satisfied.)
  Number of sets: 1
  Total thickness L: 4 nm (as i=0, $(0.3+0)d_1 \leq L \leq (0.7+0)d_1$ is satisfied.)
First Multilayer Reflective Film 21
  Mo layer: 3 nm
  Si layer: 4 nm
  First cycle length $d_1$: 7 nm (6.8 nm $\leq d_1 \leq$ 7.2 nm is satisfied.)
  Mo layer/$d_1$: 0.43 (from 0.25 to 0.55 is satisfied.)
  Number of sets: 30 (from 20 to 36 sets is satisfied.)
  Total thickness: 210 nm
Reflective Layer 20
  Total thickness: 294 nm (at most 600 nm is satisfied.)
With respect to the prepared reflective layer-coated substrate 1 for EUVL, the calculation of the EUV reflectivity was carried out in the same manner as in Example 1.

As a result, the peak value of the EUV reflectivity was 70.7%, $R_{min}$ was 59.9%, the absolute value ($\Delta R$) of the fluctuation range of the EUV reflectivity was 10.8%, and the fluctuation range based on $R_{min}$ ($\Delta R/R_{min}$) was 18.0%, and thus, the result did not satisfy within $R_{min} \times 1/10$.

Comparative Example 8

This Example was carried out in the same manner as in Example 1 except that the second multilayer reflective film 22, the adjustment layer 23 and the first multilayer reflective film 21 were as follows.
Second Multilayer Reflective Film 22
  Mo layer: 3 nm
  Si layer: 4 nm
  Second cycle length $d_2$: 7 nm ($0.9d_1 \leq d_2 \leq 1.1d_1$ is satisfied.)
  Mo layer/$d_2$: 0.43 (from 0.25 to 0.55 is satisfied.)
  Number of sets: 10 (from 3 to 31 sets is satisfied.)
  Total thickness: 70 nm Adjustment Layer 23
  Mo layer: 1.6 nm
  Si layer: 2.4 nm
  Third cycle length $d_3$: 4 nm ($d_3 \leq 0.8 d_1$ is satisfied.)
  Mo layer/$d_3$: 0.4 (from 0.3 to 0.7 is satisfied.)
  Number of sets: 2
  Total thickness L: 8 nm (($(0.3+i)d_1 \leq L \leq (0.7+i)d_1$ is not satisfied.)
First Multilayer Reflective Film 21
  Mo layer: 3 nm
  Si layer: 4 nm
  First cycle length $d_1$: 7 nm (6.8 nm $\leq d_1 \leq$ 7.2 nm is satisfied.)
  Mo layer/$d_1$: 0.43 (from 0.25 to 0.55 is satisfied.)
  Number of sets: 30 (from 20 to 36 sets is satisfied.)
  Total thickness: 210 nm
Reflective Layer 20
  Total thickness: 288 nm (at most 600 nm is satisfied.)
  With respect to the prepared reflective layer-coated substrate 1 for EUVL, the calculation of the EUV reflectivity was carried out in the same manner as in Example 1.
  As a result, the peak value of the EUV reflectivity was 72.8%, $R_{min}$ was 60.9%, the absolute value ($\Delta R$) of the fluctuation range of the EUV reflectivity was 11.9%, and the fluctuation range based on $R_{min}$ ($\Delta R / R_{min}$) was 19.5%, and thus, the result did not satisfy within $R_{min} \times 1/10$.

Comparative Example 9

This Example was carried out in the same manner as in Example 1 except that the second multilayer reflective film 22, the adjustment layer 23 and the first multilayer reflective film 21 were as follows.
Second Multilayer Reflective Film 22
  Mo layer: 4 nm
  Si layer: 3 nm
  Second cycle length $d_2$: 7 nm ($0.9 d_1 \leq d_2 \leq 1.1 d_1$ is satisfied.)
  Mo layer/$d_2$: 0.43 (from 0.25 to 0.55 is satisfied.)
  Number of sets: 10 (from 3 to 31 sets is satisfied.)
  Total thickness: 70 nm
Adjustment Layer 23
  Mo layer: 1.6 nm
  Si layer: 2.4 nm
  Third cycle length $d_3$: 4 nm ($d_3 \leq 0.8 d_1$ is satisfied.)
  Mo layer/$d_3$: 0.4 (from 0.3 to 0.7 is satisfied.)
  Number of sets: 3
  Total thickness L: 12 nm (($(0.3-i)d_1 \leq L \leq (0.7+i)d_1$ is not satisfied.)
First Multilayer Reflective Film 21
  Mo layer: 4 nm
  Si layer: 3 nm
  First cycle length $d_1$: 7 nm (6.8 nm $\leq d_1 \leq$ 7.2 nm is satisfied.)
  Mo layer/$d_1$: 0.43 (from 0.25 to 0.55 is satisfied.)
  Number of sets: 30 (from 20 to 36 sets is satisfied.)
  Total thickness: 210 nm
Reflective Layer 20
  Total thickness: 292 nm (at most 600 nm is satisfied.)
  With respect to the prepared reflective layer-coated substrate 1 for EUVL, the calculation of the EUV reflectivity was carried out in the same manner as in Example 1.
  As a result, the peak value of the EUV reflectivity was 71.3%, $R_{min}$ was 56.1%, the absolute value ($\Delta R$) of the fluctuation range of the EUV reflectivity was 15.2%, and the fluctuation range based on $R_{min}$ ($\Delta R / R_{min}$) was 27.0%, and thus, the result did not satisfy within $R_{min} \times 1/10$.

Comparative Example 10

This Example was carried out in the same manner as in Example 1 except that the second multilayer reflective film 22, the adjustment layer 23 and the first multilayer reflective film 21 were as follows.
Second Multilayer Reflective Film 22
  Mo layer: 3 nm
  Si layer: 4 nm
  Second cycle length $d_2$: 7 nm ($0.9 d_1 \leq d_2 \leq 1.1 d_1$ is satisfied.)
  Mo layer/$d_2$: 0.43 (from 0.25 to 0.55 is satisfied.)
  Number of sets: 3 (from 3 to 31 sets is satisfied.)
  Total thickness: 21 nm
Adjustment Layer 23
  Mo layer: 1.5 nm
  Si layer: 2.3 nm
  Third cycle length $d_3$: 3.8 nm ($d_3 \leq 0.8 d_1$ is satisfied.)
  Mo layer/$d_3$: 0.4 (from 0.3 to 0.7 is satisfied.)
  Number of sets: 1
  Total thickness L: 3.8 nm (as i=0, $(0.3+0)d_1 \leq L \leq (0.7+0)d_1$ is satisfied.)
First Multilayer Reflective Film 21
  Mo layer: 3 nm
  Si layer: 4 nm
  First cycle length $d_1$: 7 nm (6.8 nm $\leq d_1 \leq$ 7.2 nm is satisfied.)
  Mo layer/$d_1$: 0.43 (from 0.25 to 0.55 is satisfied.)
  Number of sets: 19 (from 20 to 36 sets is not satisfied.)
  Total thickness: 133 nm
Reflective Layer 20
  Total thickness: 158 nm (at most 600 nm is satisfied.)
  With respect to the prepared reflective layer-coated substrate 1 for EUVL, the calculation of the EUV reflectivity was carried out in the same manner as in Example 1.
  As a result, the peak value of the EUV reflectivity was 54.0%, but $R_{min}$ was 49.1% and thus was less than 50%.

Comparative Example 11

This Example was carried out in the same manner as in Example 1 except that the second multilayer reflective film 22, the adjustment layer 23 and the first multilayer reflective film 21 were as follows.
Second Multilayer Reflective Film 22
  Mo layer: 3 nm
  Si layer: 4 nm
  Second cycle length $d_2$: 7 nm ($0.9 d_1 \leq d_2 \leq 1.1 d_1$ is satisfied.)
  Mo layer/$d_2$: 0.43 (from 0.25 to 0.55 is satisfied.)
  Number of sets: 31 (from 3 to 31 sets is satisfied.)
  Total thickness: 217 nm
Adjustment Layer 23
  Mo layer: 1.5 nm
  Si layer: 2.3 nm
  Third cycle length $d_3$: 3.8 nm ($d_3 \leq 0.8 d_1$ is satisfied.)
  Mo layer/$d_3$: 0.4 (from 0.3 to 0.7 is satisfied.)
  Number of sets: 1
  Total thickness L: 3.8 nm (as i=0, $(0.3+0)d_1 \leq L \leq (0.7+0)d_1$ is satisfied.)
First Multilayer Reflective Film 21
  Mo layer: 3 nm
  Si layer: 4 nm
  First cycle length $d_1$: 7 nm (6.8 nm $\leq d_1 \leq$ 7.2 nm is satisfied.)
  Mo layer/$d_1$: 0.43 (from 0.25 to 0.55 is satisfied.)
  Number of sets: 37 (from 20 to 36 sets is not satisfied.)
  Total thickness: 259 nm Reflective Layer 20
  Total thickness: 480 nm (at most 600 nm is satisfied.)
  With respect to the prepared reflective layer-coated substrate 1 for EUVL, the calculation of the EUV reflectivity was carried out in the same manner as in Example 1.
  As a result, the peak value of the EUV reflectivity was 71.5%, $R_{min}$ was 64.5%, the absolute value ($\Delta R$) of the fluctuation range of the EUV reflectivity was 7.0%, and the fluctuation range based on $R_{min}$ ($\Delta R/R_{min}$) was 10.8%, and thus, the result did not satisfy within $R_{min} \times 1/10$.

Comparative Example 12

This Example was carried out in the same manner as in Example 1 except that the second multilayer reflective film 22, the adjustment layer 23 and the first multilayer reflective film 21 were as follows.
Second Multilayer Reflective Film 22
  Mo layer: 3 nm
  Si layer: 4 nm
  Second cycle length $d_2$: 7 nm ($0.9 d_1 \leq d_2 \leq 1.1 d_1$ is satisfied.)
  Mo layer/$d_2$: 0.43 (from 0.25 to 0.55 is satisfied.)
  Number of sets: 2 (from 3 to 31 sets is not satisfied.)
  Total thickness: 14 nm
Adjustment Layer 23
  Mo layer: 1.5 nm
  Si layer: 2.3 nm
  Third cycle length $d_3$: 3.8 nm ($d_3 \leq 0.8 d_1$ is satisfied.)
  Mo layer/$d_3$: 0.4 (from 0.3 to 0.7 is satisfied.)
  Number of sets: 1
  Total thickness L: 3.8 nm (as i=0, $(0.3+0)d_1 \leq L \leq (0.7+0)d_1$ is satisfied.)
First Multilayer Reflective Film 21
  Mo layer: 3 nm
  Si layer: 4 nm
  First cycle length $d_1$: 7 nm ($6.8 \text{ nm} \leq d_1 \leq 7.2 \text{ nm}$ is satisfied.)
  Mo layer/$d_1$: 0.43 (from 0.25 to 0.55 is satisfied.)
  Number of sets: 20 (from 20 to 36 sets is satisfied.)
  Total thickness: 140 nm
Reflective layer 20
  Total thickness: 158 nm (at most 600 nm is satisfied.)
  With respect to the prepared reflective layer-coated substrate 1 for EUVL, the calculation of the EUV reflectivity was carried out in the same manner as in Example 1.
  As a result, the peak value of the EUV reflectivity was 57.6%, $R_{min}$ was 51.6%, the absolute value ($\Delta R$) of the fluctuation range of the EUV reflectivity was 5.9%, and the fluctuation range based on $R_{min}$ ($\Delta R/R_{min}$) was 11.5%, and thus, the result did not satisfy within $R_{min} \times 1/10$.

Comparative Example 13

This Example was carried out in the same manner as in Example 1 except that the second multilayer reflective film 22, the adjustment layer 23 and the first multilayer reflective film 21 were as follows.
Second Multilayer Reflective Film 22
  Mo layer: 3 nm
  Si layer: 4 nm
  Second cycle length $d_2$: 7 nm ($0.9 d_1 \leq d_2 \leq 1.1 d_1$ is satisfied.)
  Mo layer/$d_2$: 0.43 (from 0.25 to 0.55 is satisfied.)
  Number of sets: 32 (from 3 to 31 sets is not satisfied.)
  Total thickness: 224 nm
Adjustment Layer 23
  Mo layer: 1.5 nm
  Si layer: 2.3 nm
  Third cycle length $d_3$: 3.8 nm ($d_3 \leq 0.8 d_1$ is satisfied.)
  Mo layer/$d_3$: 0.4 (from 0.3 to 0.7 is satisfied.)
  Number of sets: 1
  Total thickness L: 3.8 nm (as i=0, $(0.3+0)d_1 \leq L \leq (0.7+0)d_1$ is satisfied.)
First Multilayer Reflective Film 21
  Mo layer: 3 nm
  Si layer: 4 nm
  First cycle length $d_1$: 7 nm ($6.8 \text{ nm} \leq d_1 \leq 7.2 \text{ nm}$ is satisfied.)
  Mo layer/$d_1$: 0.43 (from 0.25 to 0.55 is satisfied.)
  Number of sets: 36 (from 20 to 36 sets is satisfied.)
  Total thickness: 140 nm
Reflective Layer 20
  Total thickness: 480 nm (at most 600 nm is satisfied.)
  With respect to the prepared reflective layer-coated substrate 1 for EUVL, the calculation of the EUV reflectivity was carried out in the same manner as in Example 1.
  As a result, the peak value of the EUV reflectivity was 71.3%, $R_{min}$ was 64.8%, the absolute value ($\Delta R$) of the fluctuation range of the EUV reflectivity was 6.5%, and the fluctuation range based on $R_{min}$ ($\Delta R/R_{min}$) was 10.02%, and thus, the result did not satisfy within $R_{min} \times 1/10$.

REFERENCE SYMBOLS

1: Reflective layer-coated substrate for EUVL
2: Mask blank for EUVL
10: Substrate
20: Reflective layer
21: First multilayer reflective film
22: Second multilayer reflective film
23: Adjustment layer
30: Absorber layer The entire disclosure of Japanese Patent Application No. 2013-030848 filed on Feb. 20, 2013 including specification, claims, drawings and summary is incorporated herein by reference in its entirety.

What is claimed is:

1. A reflective layer-coated substrate for EUV lithography (EUVL), comprising a substrate, and a reflective layer for reflecting EUV light, formed on the substrate, wherein
the reflective layer comprises a second multilayer reflective film having a Mo layer and a Si layer alternately stacked plural times on the substrate, an adjustment layer stacked on the second multilayer reflective film, and a first multilayer reflective film having a Mo layer and a Si layer alternately stacked plural times on the adjustment layer;
in the first multilayer reflective film, from 20 to 36 sets are stacked in such a relation that the first cycle length $d_1$ being the total thickness of one set of adjacent Mo layer and Si layer is $6.8 \text{ nm} \leq d_1 \leq 7.2 \text{ nm}$;
in the adjustment layer, a Mo layer and a Si layer are alternately stacked in at least one set, the total thickness $d_3$ of adjacent Mo layer and Si layer satisfies $d_3 \leq 0.8 d_1$ or $1.2 d_1 \leq d_3$, and the thickness L of the entire adjustment layer is $(0.3+i)d_1 \leq L \leq (0.7+i)d_1$, wherein i is an integer greater than or equal to 0;
in the second multilayer reflective film, from 3 to 31 sets are stacked in such a relation that the second cycle length $d_2$ being the total thickness of one set of adjacent Mo layer and Si layer is $0.9 d_1 \leq d_2 \leq 1.1 d_1$;
the ratio of the thickness of a Mo layer in the first multilayer reflective film to the first cycle length $d_1$ is from 0.25 to 0.55;
the ratio of the thickness of a Mo layer in the second multilayer reflective film to the second cycle length $d_2$ is from 0.25 to 0.55; and
the total thickness of the reflective layer is at most 600 nm.

2. The reflective layer-equipped substrate for EUVL according to claim 1, wherein the total thickness of the reflective layer is at most 400 nm.

3. The reflective layer-equipped substrate for EUVL according to claim 1, wherein the first cycle length $d_1$ and the second cycle length $d_2$ are substantially equal.

4. The reflective layer-equipped substrate for EUVL according to claim 1, wherein the ratio of the thickness of a Mo layer in the adjustment layer to the third cycle length $d_3$ is from 0.3 to 0.7.

5. A reflective mask blank for EUV lithography (EUVL), comprising a substrate, a reflective layer for reflecting EUV light, formed on the substrate, and an absorber layer for absorbing EUV light, formed on the reflective layer, wherein
- the reflective layer comprises a second multilayer reflective film having a second low refractive index layer and a second high refractive index layer alternately stacked plural times on the substrate, an adjustment layer stacked on the second multilayer reflective film, and a first multilayer reflective film having a Mo layer and a Si layer alternately stacked plural times on the adjustment layer;
- in the first multilayer reflective film, from 20 to 36 sets are stacked in such a relation that the first cycle length $d_1$ being the total thickness of one set of adjacent Mo layer and Si layer is 6.8 nm≤$d_1$≤7.2 nm;
- in the adjustment layer, a Mo layer and a Si layer are alternately stacked in at least one set, the total thickness $d_3$ of adjacent Mo layer and Si layer satisfies $d_3$≤0.8$d_1$ or 1.2$d_1$≤$d_3$, and the thickness L of the entire adjustment layer is (0.3+i)$d_1$≤L≤(0.7+i)$d_1$, wherein i is an integer greater than or equal to 0;
- in the second multilayer reflective film, from 3 to 31 sets are stacked in such a relation that the second cycle length $d_2$ being the total thickness of one set of adjacent Mo layer and Si layer is 0.9$d_1$≤$d_2$≤1.1$d_1$;
- the ratio of the thickness of a Mo layer in the first multilayer reflective film to the first cycle length $d_1$ is from 0.25 to 0.55;
- the ratio of the thickness of a Mo layer in the second multilayer reflective film to the second cycle length $d_2$ is from 0.25 to 0.55; and
- the total thickness of the reflective layer is at most 600 nm.

6. The reflective mask blank for EUVL according to claim 5, wherein the total thickness of the reflective layer is at most 400 nm.

7. The reflective mask blank for EUVL according to claim 5, wherein the first cycle length $d_1$ and the second cycle length $d_2$ are substantially equal.

8. The reflective mask blank for EUVL according to claim 5, wherein the ratio of the thickness of a Mo layer in the adjustment layer to the third cycle length $d_3$ is from 0.3 to 0.7.

9. The reflective mask blank for EUVL according to claim 5, which has a protective layer for the reflective layer, between the reflective layer and the absorber layer.

* * * * *